United States Patent
Olson

(10) Patent No.: US 8,451,695 B2
(45) Date of Patent: May 28, 2013

(54) VERTICAL CAVITY SURFACE EMITTING LASER WITH INTEGRATED MIRROR AND WAVEGUIDE

(75) Inventor: Scott Eugene Olson, Eagan, MN (US)

(73) Assignee: Seagate Technology LLC, Cupertino, CA (US)

( * ) Notice: Subject to any disclaimer, the term of this patent is extended or adjusted under 35 U.S.C. 154(b) by 22 days.

(21) Appl. No.: 13/167,304

(22) Filed: Jun. 23, 2011

(65) Prior Publication Data

US 2012/0327754 A1 Dec. 27, 2012

(51) Int. Cl.
*G11B 11/00* (2006.01)

(52) U.S. Cl.
USPC ........................................ 369/13.01

(58) Field of Classification Search
None
See application file for complete search history.

(56) References Cited

U.S. PATENT DOCUMENTS

| | | | |
|---|---|---|---|
| 5,837,561 A | 11/1998 | Kish, Jr. et al. | |
| 6,021,146 A | 2/2000 | Jiang et al. | |
| 6,026,111 A | 2/2000 | Jiang et al. | |
| 6,064,783 A | 5/2000 | Congdon et al. | |
| 6,236,773 B1 | 5/2001 | Butler et al. | |
| 6,584,135 B2 | 6/2003 | Wipiejewski | |
| 6,628,695 B1 | 9/2003 | Aldaz et al. | |
| 6,944,112 B2 | 9/2005 | Challener | |
| 6,963,530 B1 | 11/2005 | Thornton et al. | |
| 6,975,661 B2 | 12/2005 | Skogman | |
| 7,022,539 B2 | 4/2006 | Sato et al. | |
| 7,133,230 B2 | 11/2006 | Saga et al. | |
| 7,180,927 B2 | 2/2007 | Kwak et al. | |
| 7,218,660 B2 | 5/2007 | Koelle et al. | |
| 7,327,667 B2 | 2/2008 | Thornton et al. | |
| 7,443,898 B2 | 10/2008 | Schmid et al. | |
| 7,609,480 B2 | 10/2009 | Shukh et al. | |
| 7,643,248 B2 | 1/2010 | Sluzewski | |
| RE41,928 E * | 11/2010 | Miyagawa et al. | 369/44.12 |
| 7,949,218 B2 | 5/2011 | Gage et al. | |
| 8,116,171 B1 * | 2/2012 | Lee | 369/13.01 |
| 8,184,507 B1 * | 5/2012 | Hirano et al. | 369/13.33 |
| 2006/0233061 A1 * | 10/2006 | Rausch et al. | 369/13.32 |
| 2007/0081427 A1 | 4/2007 | Suh et al. | |
| 2007/0159720 A1 | 7/2007 | Sohn et al. | |
| 2007/0297082 A1 * | 12/2007 | Peng et al. | 360/59 |
| 2009/0073858 A1 | 3/2009 | Seigler et al. | |
| 2010/0214685 A1 | 8/2010 | Seigler et al. | |
| 2011/0235480 A1 * | 9/2011 | Goulakov et al. | 369/13.35 |
| 2012/0113770 A1 * | 5/2012 | Stipe | 369/13.33 |
| 2012/0163138 A1 * | 6/2012 | Gage et al. | 369/13.11 |
| 2012/0195341 A1 * | 8/2012 | Boone et al. | 372/50.1 |
| 2012/0257490 A1 * | 10/2012 | Zhou | 369/121 |

* cited by examiner

*Primary Examiner* — Adam R Giesy
*Assistant Examiner* — Henok Heyi
(74) *Attorney, Agent, or Firm* — Hollingsworth Davis, LLC

(57) ABSTRACT

An apparatus includes an extended cavity vertical cavity surface emitting laser producing light and having an active region, a first reflector position adjacent to a first side of the active region, an extended cavity positioned adjacent to a second side of the active region, and a second reflector reflecting a first portion of the light into the extended cavity and transmitting a second portion of the light, a planar waveguide positioned adjacent to the extended cavity vertical cavity surface emitting laser, and a horizontal coupler structured to couple the second portion of light from the extended cavity vertical cavity surface emitting laser into the waveguide.

20 Claims, 6 Drawing Sheets

VERTICAL CAVITY SURFACE EMITTING LASER WITH INTEGRATED MIRROR AND WAVEGUIDE

BACKGROUND

Heat assisted magnetic recording (HAMR) generally refers to the concept of locally heating a recording media to reduce the coercivity of the media so that an applied magnetic writing field can more easily direct the magnetization of the media during the temporary magnetic softening of the media caused by the heat source. A tightly confined, high power laser light spot is used to heat a portion of the recording media to substantially reduce the coercivity of the heated portion. Then the heated portion is subjected to a magnetic field that sets the direction of magnetization of the heated portion. In this manner, the coercivity of the media at ambient temperature can be much higher than the coercivity during recording, thereby enabling stability of the recorded bits at much higher storage densities and with much smaller bit cells.

Light can be directed onto recording media using a planar solid immersion mirror (PSIM), or lens, fabricated on a planar waveguide; and a near-field transducer (NFT), in the form of an isolated metallic nanostructure, placed near the PSIM focus. The near-field transducer is designed to reach a local surface plasmon (LSP) condition at a designated light wavelength. At LSP, a high field surrounding the near-field transducer appears, due to collective oscillation of electrons in the metal. Part of the field will tunnel into an adjacent media and get absorbed, raising the temperature of the media locally for recording.

High levels of optical radiation are needed in the HAMR head in order to provide rapid heating of magnetic media.

SUMMARY

In one aspect, the disclosure provides an apparatus including an extended cavity vertical cavity surface emitting laser producing light and having an active region, a first reflector position adjacent to a first side of the active region, an extended cavity positioned adjacent to a second side of the active region, and a second reflector reflecting a first portion of the light into the extended cavity and transmitting a second portion of the light, a planar waveguide positioned adjacent to the extended cavity vertical cavity surface emitting laser, and a horizontal coupler structured to couple the second portion of light from the extended cavity vertical cavity surface emitting laser into the waveguide.

DETAILED DESCRIPTION

Figure 1:
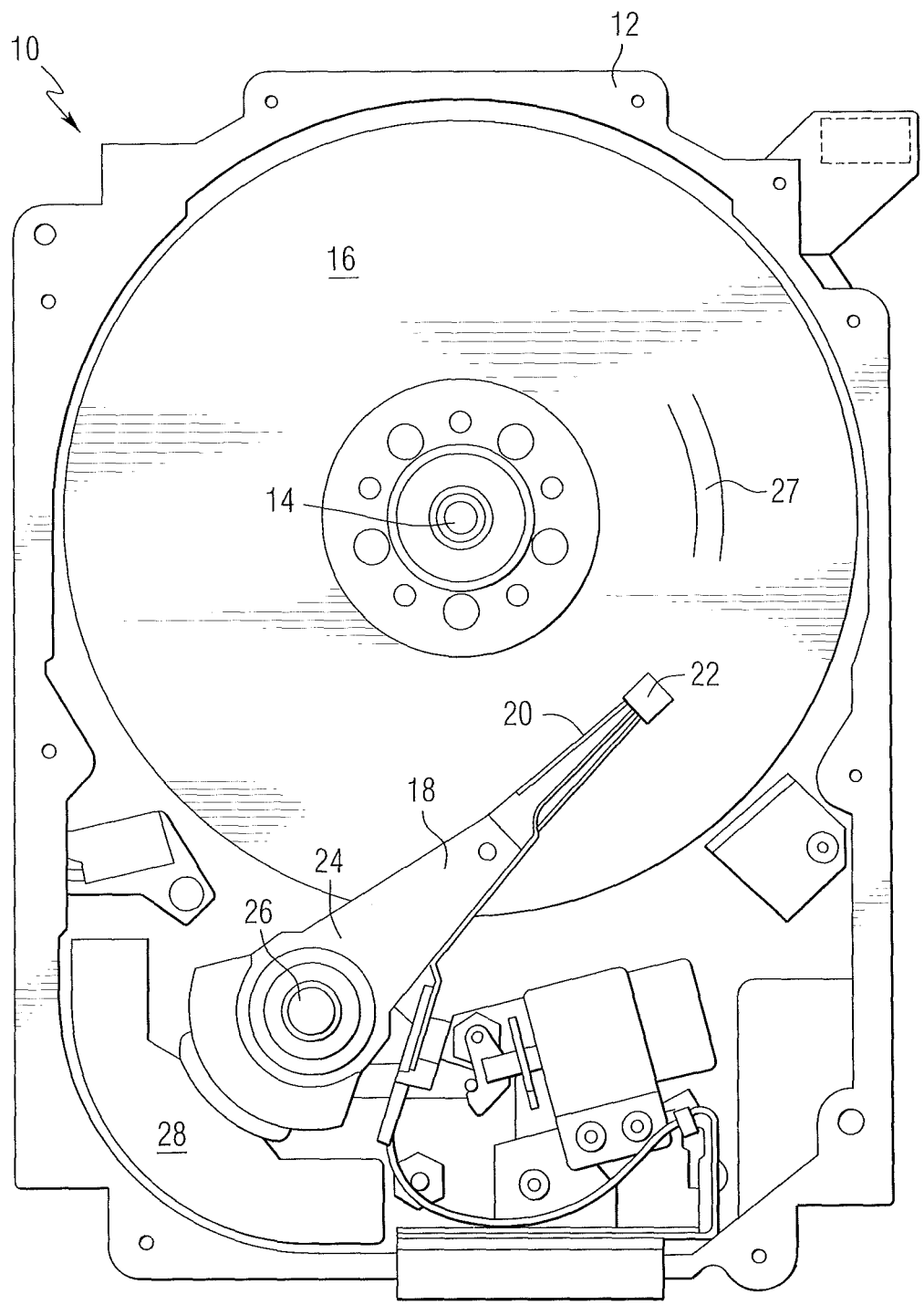
FIG. 1 is a pictorial representation of a data storage device in the form of a disc drive that can include a recording head in accordance with an aspect of this disclosure.

FIG. 1 is a pictorial representation of a data storage device in the form of a disc drive 10 that can utilize a recording head constructed in accordance with an aspect of the disclosure. The disc drive 10 includes a housing 12 (with the upper portion removed and the lower portion visible in this view) sized and configured to contain the various components of the disc drive. The disc drive 10 includes a spindle motor 14 for rotating at least one magnetic recording media 16 within the housing. At least one arm 18 is contained within the housing 12, with each arm 18 having a first end 20 with a recording head or slider 22, and a second end 24 pivotally mounted on a shaft by a bearing 26. An actuator motor 28 is located at the arm's second end 24 for pivoting the arm 18 to position the recording head 22 over a desired track 27 of the disc 16. The actuator motor 28 is regulated by a controller, which is not shown in this view and is well-known in the art.

For heat assisted magnetic recording (HAMR), an electromagnetic wave of, for example, visible, infrared or ultraviolet light is directed onto a surface of a data storage medium to raise the temperature of a localized area of the medium to facilitate switching of the magnetization of the area. Recent designs of HAMR recording heads include a thin film waveguide on a slider to guide light to the storage medium for localized heating of the storage medium. As is known in the art, heat assisted magnetic recording is also called thermally assisted magnetic recording. In this description, heat assisted magnetic recording incorporates devices and methods in which data is recorded at elevated temperatures.

Figure 2:
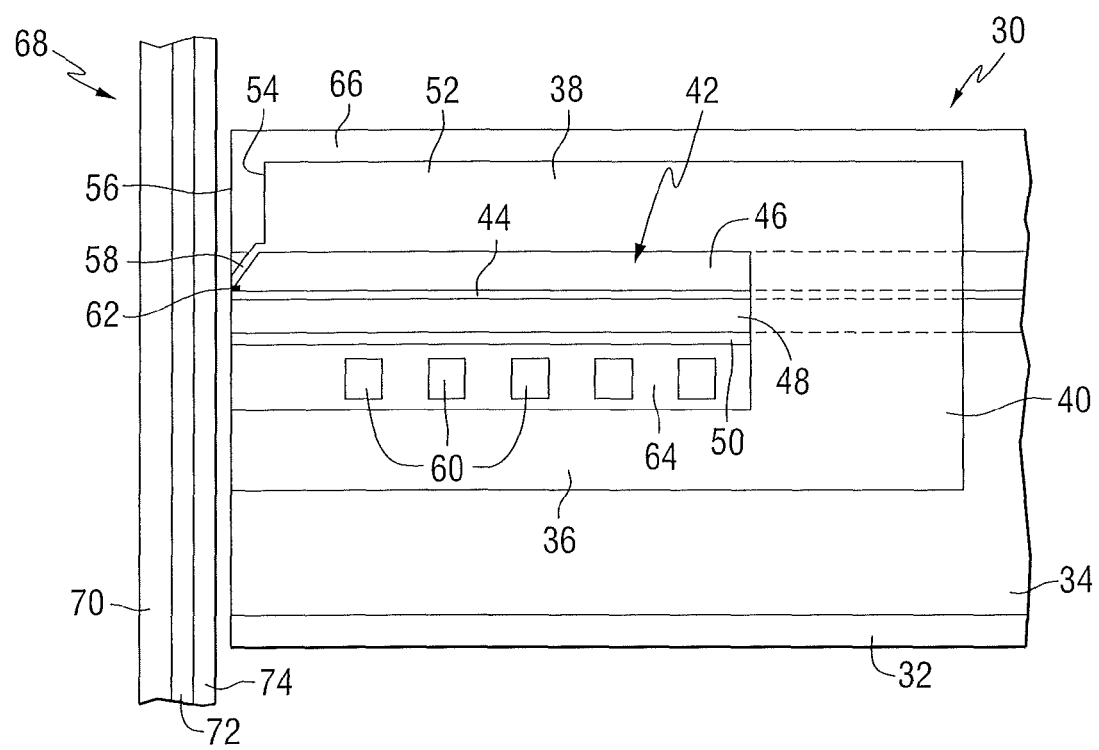
FIG. 2 is a cross-sectional view of a portion of a recording head.

FIG. 2 is a cross-sectional view of an example of a recording head for use in heat assisted magnetic recording. The recording head 30 includes a substrate 32, a base coat 34 on the substrate, a bottom pole 36 on the base coat, and a top pole 38 that is magnetically coupled to the bottom pole through a yoke or pedestal 40. A waveguide 42 is positioned between the top and bottom poles. The waveguide includes a core layer 44 and cladding layers 46 and 48 on opposite sides of the core layer. A mirror 50 is positioned adjacent to one of the cladding layers. The top pole is a two-piece pole that includes a first portion, or pole body 52, having a first end 54 that is spaced from the air bearing surface 56, and a second portion, or sloped pole piece 58, extending from the first portion and tilted in a direction toward the bottom pole. The second portion is structured to include an end adjacent to the air bearing surface 56 of the recording head, with the end being closer to the waveguide than the first portion of the top pole. A planar coil 60 also extends between the top and bottom poles and around the pedestal. A near-field transducer (NFT) 62 is positioned in the cladding layer 46 adjacent to the air bearing surface. An insulating material 64 separates the coil turns. Another layer of insulating material 66 is positioned adjacent to the top pole.

A recording medium 68 is positioned adjacent to or under the recording head 30. The recording medium 68 in this example includes a substrate 70, a soft magnetic underlayer 72 on the substrate 70, and a hard magnetic recording layer 74 on the soft underlayer 72.

The optical waveguide acts in association with a source of electromagnetic radiation which transmits electromagnetic radiation to the waveguide. For the purposes of this description, the electromagnetic radiation is referred to as light. The light is coupled to the optical waveguide by a coupling means such as a grating. The light propagates through the optical waveguide toward the recording medium to heat a localized area of the recording layer. In one aspect of this disclosure, the light source is a vertical cavity surface emitting laser diode. Although the recording head may be a perpendicular magnetic recording head and the storage medium may be a perpendicular magnetic recording medium, it will be appreciated that the disclosure may also be used in conjunction with other types of recording heads and/or recording mediums where it may be desirable to employ heat assisted recording.

Figure 3:
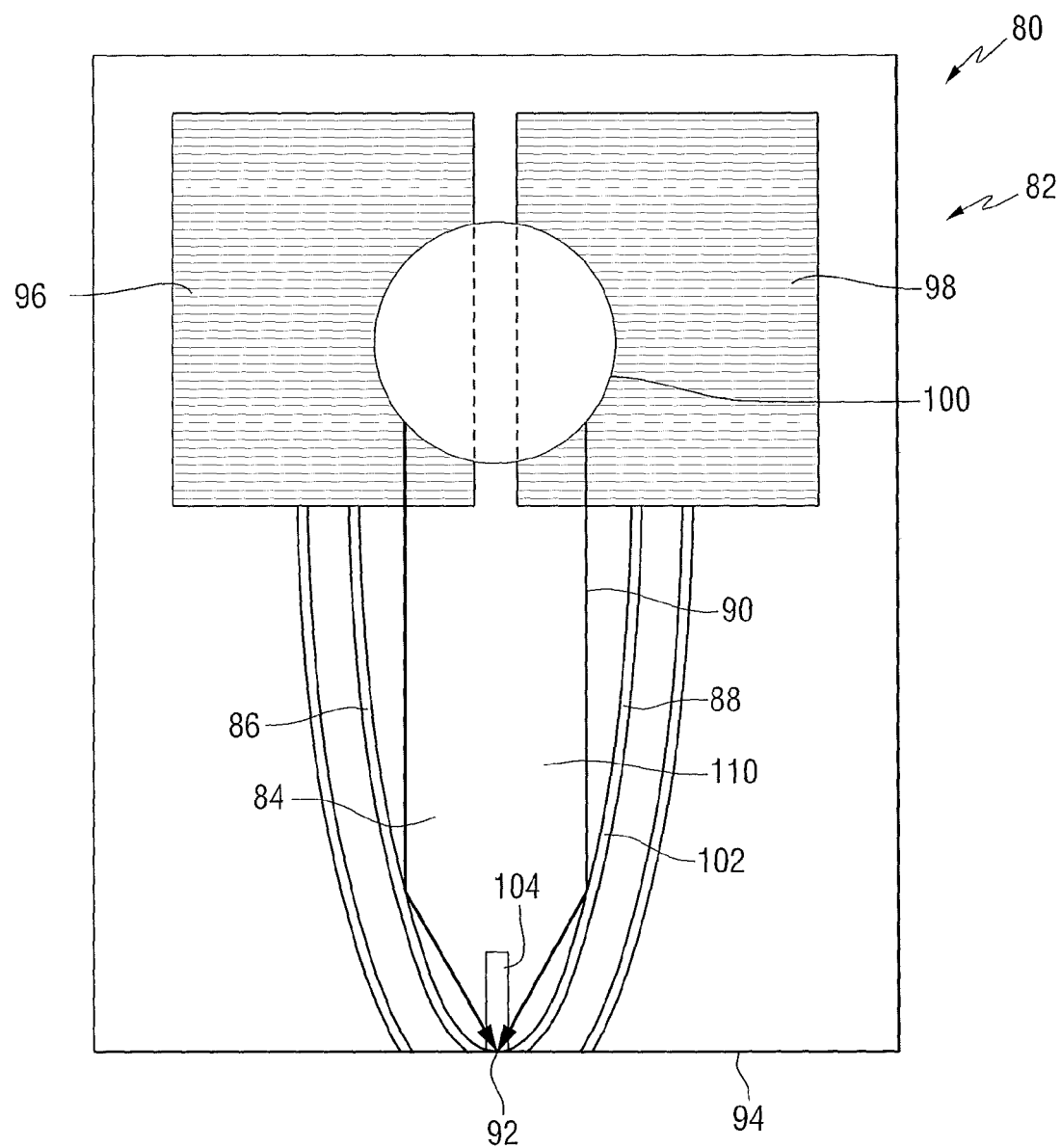
FIG. 3 is an elevation view of a waveguide that may be used in the recording head of FIG. 2.

FIG. 3 is an elevation view of a waveguide 80 in a recording head 82. The waveguide includes a planar core layer 84 having generally parabolic edges 86 and 88, shaped to reflect light 90 to a focal point 92 at or near the air bearing surface 94. Gratings 96 and 98 are positioned on the core layer and used to couple light into the core layer. The gratings can be offset with respect to each other so that the electric component of the light in the two sides of the waveguide adds at the focal point. The light that impinges the gratings is shown as a spot 100. A reflective coating 102, which can be Au, is provided along the edges of the core layer. This arrangement forms a solid immersion mirror. A return pole 104 is positioned adjacent to the air bearing surface.

In one embodiment, the light impinges the gratings from a direction that is substantially perpendicular to the plane of the waveguide. To direct the light toward the air bearing surface, one of several methods for coupling a normal-incidence laser source would need to be employed. For example, a normal incident grating coupler such as an angled blazed grating can be used.

Vertical cavity surface emitting lasers (VCSELs) are a type of semiconductor laser in which light is emitted out of a typically circular aperture at either the top or bottom of the device instead of the side as is done with edge-emitting lasers. The geometry of VCSELs reduces manufacturing costs, increases yield and has a number of other advantages including narrower line width, no astigmatism, reduced sensitivity to feedback noise, etc. In one aspect of the disclosure, a VCSEL is mounted on the recording head.

Vertical cavity surface emitting lasers (VCSELs) offer many advantages for assembly into a HAMR system. VCSEL assemblies that are capable of delivering the power required for HAMR, for example external cavity VCSELs, have been proposed as a light source for HAMR. Because of their size of about 0.5 mm to about 1 mm in length, it is difficult to incorporate VCSELs into existing HAMR slider designs. In order to generate high power single mode light, an external cavity VCSEL can be used.

Figure 4:
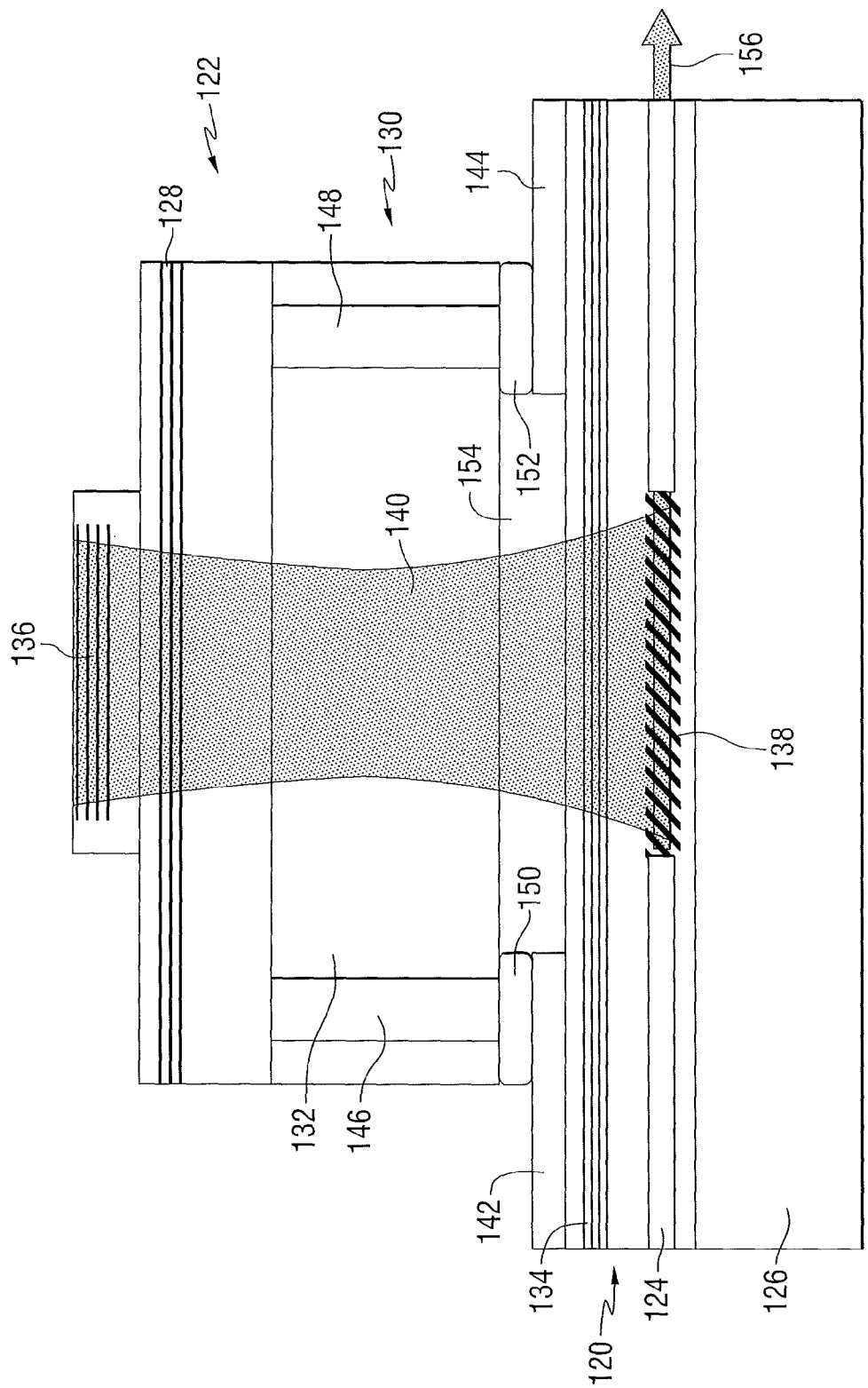
FIG. 4 is a side view of a portion of a recording head including a vertical cavity surface emitting laser.

In one aspect, the disclosure provides a transducer assembly including an external cavity VCSEL, a waveguide, and a coupler for coupling light from the VCSEL into the waveguide. FIG. 4 is a side view of a portion of a slider 120 that includes a transducer assembly having an extended cavity vertical cavity surface emitting laser diode 122 mounted on a waveguide 124. The waveguide is mounted on a submount or recording head 126. The laser diode includes an active portion 128 including known active elements of a VCSEL that are used to produce light, and an extended cavity portion 130. The extended cavity portion includes a transparent stand-off 132 and a first mirror 134 (also referred to as a reflector). The first mirror 134 is positioned adjacent to the waveguide 124. The active portion is located near the end of the VCSEL that is opposite the waveguide. A second mirror 136 (also referred to as a reflector) is positioned adjacent to the active region on a side opposite to the side facing the extended cavity. The first mirror 134 reflects a first portion of the light into the extended cavity and transmits a second portion of the light toward the waveguide.

A grating coupler 138 is included to couple light 140 from the laser to the waveguide. The grating coupler serves as a horizontal coupling element, and can be for example a blazed grating. Electrical contacts 142 and 144 are electrically connected to vias 146 and 148 by a conductive adhesive or solder 150 and 152. The active region of the VCSEL is electrically connected to the vias. The space 154 between the transparent stand-off 132 and the mirror 134 in FIG. 4 can be open space (air or vacuum), or a transparent material (e.g., an epoxy or silicone).

Rather than using a separate mirror to create the external cavity for the laser structure, the first mirror 134 is integrated into the laser's heat sink mount, or submount, and serves as an output coupling mirror. A transparent stand-off is positioned between the VCSEL and the submount to create the required cavity length for a laser with the appropriate optical power output. The output coupling mirror may be a layered stack of dielectric material deposited onto the submount surface, forming a high reflectance mirror.

The waveguide transmits the light toward the air bearing surface of the recording head, as illustrated by arrow 156. Light emitted from the air bearing surface is used to heat a portion of an adjacent recording medium, not shown in this view. The recording head can include other elements found in known recording heads, such as a coil for producing a magnetic field in the write pole, a read sensor, and associated components. The slider is coupled to an actuating arm by a gimbal assembly. When used in a data storage device, the axis of the laser cavity would be positioned by the arm and gimbal to be substantially parallel to the surface of a recording medium.

Mirrors may be composed of single layers or alternating layers of high and low refractive index dielectric materials, including magnesium fluoride, aluminum oxide, silicon dioxide, amorphous silicon, zinc sulfide, titanium dioxide, tantalum oxide, cerium fluoride, zirconium dioxide or other materials. The VCSEL in FIG. 4 includes an epitaxially-grown semiconductor, with an active light emitting region sandwiched between a pair of distributed Bragg reflector mirrors and metalized electrical contacts to provide current to the active region. The substrate on which the VCSEL epitaxial layers are grown may be transparent, as shown in FIG. 4, or the VCSEL may be flipped over to be mounted with the epitaxial side facing the submount.

A horizontal light coupler (e.g., the grating coupler 138) is incorporated into the submount, allowing emission into a waveguide that is also integrated into the submount, as shown in FIG. 4. In the case of a HAMR recording head, the recording head itself serves as the laser submount, so that the external cavity output coupling mirror, horizontal light coupler, and the waveguide are all integrated onto the recording head.

Electrical connections to the VCSEL may be accomplished by wire bonding directly to the VCSEL, or by using metal vias in the stand-off as shown in FIG. 4. Heat conduction is through the electrical connections, the wire bonds, or the metal vias.

An alternative embodiment includes a distributed Bragg reflector (DBR) mirror in the waveguide that is integrated into the recording head by creating an appropriate grating in the dielectric waveguide core.

Figure 5:
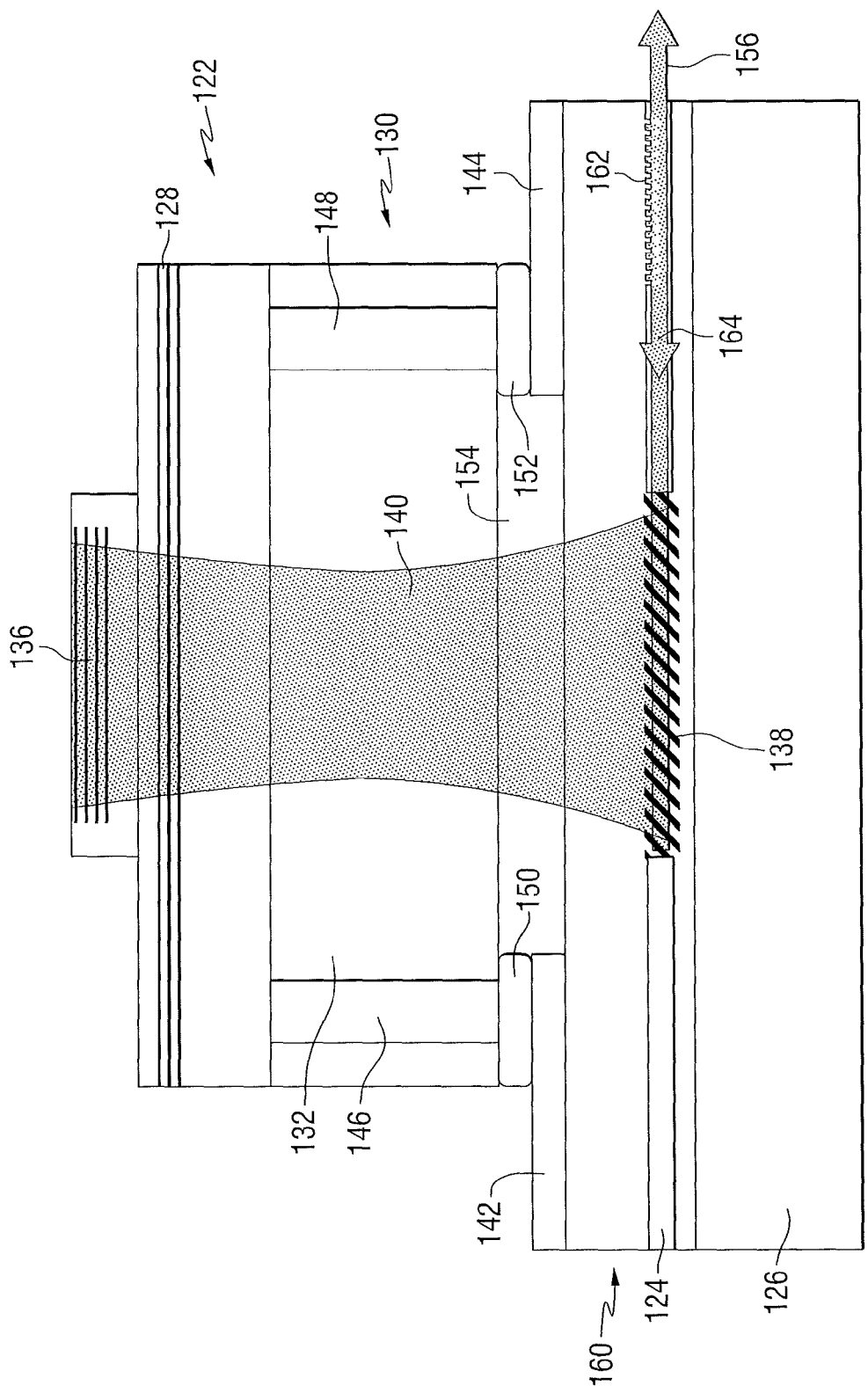
FIG. 5 is a side view of a portion of another recording head including a vertical cavity surface emitting laser.

FIG. 5 is a side view of a portion of another slider 160 that includes a transducer assembly that includes many of the elements of FIG. 4, which are identified with the same item numbers. However, FIG. 5 does not include the mirror below the standoff. Instead, a distributed Bragg reflector (DBR) 162 is positioned in the waveguide 124. The DBR reflects a portion 164 of the light back toward the coupler 138, which couples the light back into the laser cavity.

The Bragg reflector is in the waveguide, on the disc side of the horizontal coupler. It is composed of a regular pattern etched into a portion of the waveguide that is filled with a dielectric material that has a different index of refraction from the waveguide core, forming a grating designed to reflect light in the direction opposite arrow 156. In this example, the horizontal coupler couples light into the waveguide and also couples light reflected by the Bragg reflector out of the waveguide toward the active region of the laser diode.

Figure 6:
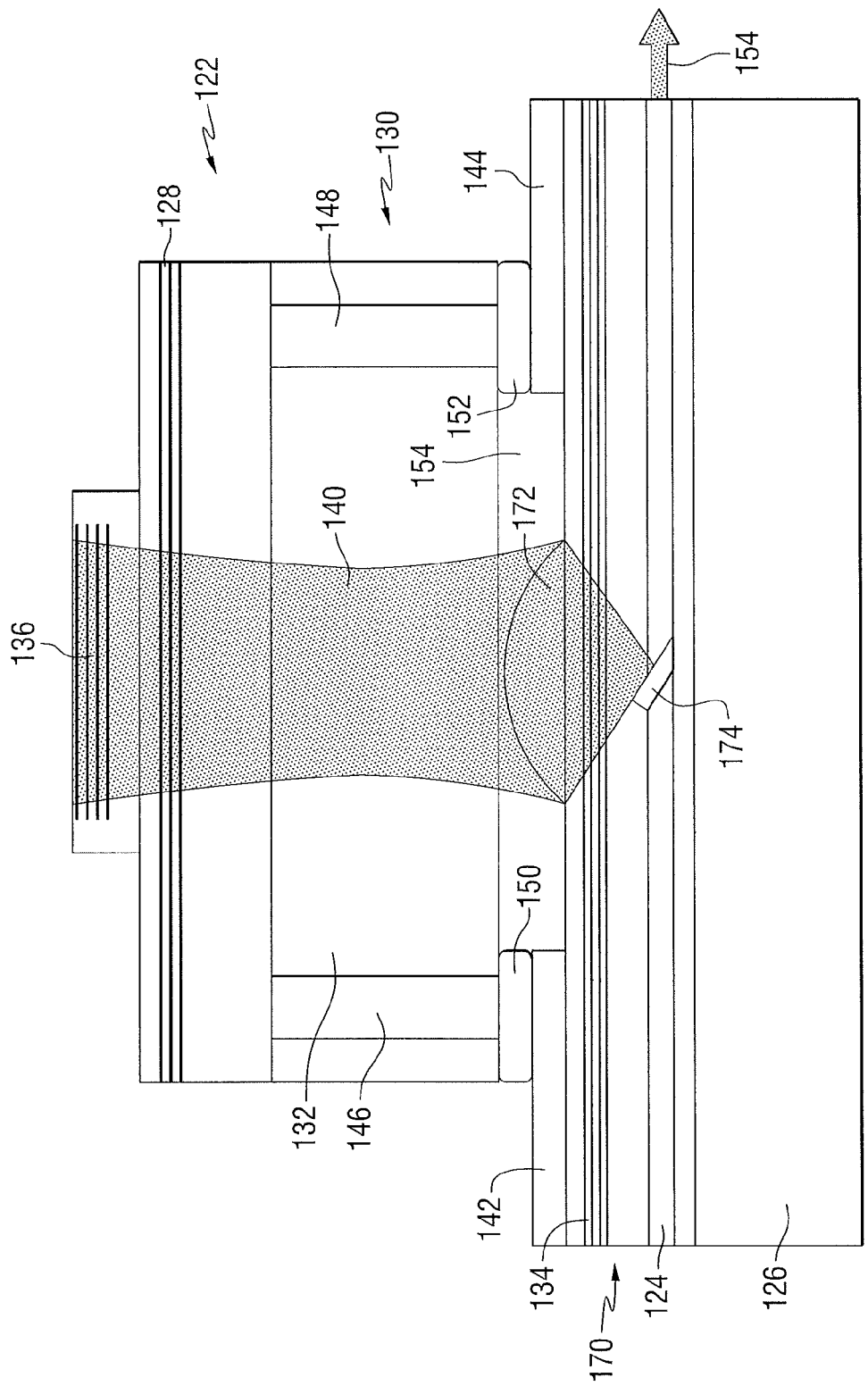
FIG. 6 is a side view of a portion of another recording head including a vertical cavity surface emitting laser.

A slanted mirror could also be used if the beam was focused to a small spot, for instance by patterning a lens into the gap between the standoff and the submount. FIG. 6 is a side view of a portion of another slider 170 that includes a transducer assembly that includes many of the elements of FIG. 4, which are identified with the same item numbers. The embodiment of FIG. 6 includes a lens 172 that focuses the light onto a slanted mirror 174, which serves as a horizontal coupler for coupling light into the waveguide 124. In FIG. 6, the lens is positioned adjacent to the mirror 134 below the standoff. However, the lens could also be positioned adjacent to the emitting surface of the standoff (i.e., at adjacent to the bottom output of the standoff).

Alignment of the VCSEL assembly with the horizontal coupler may be passive, e.g., with self-alignment features and stoppers included on the submount, on the VCSEL, and on the stand-off. Alternatively, active alignment may be accomplished by first bonding the stand-off to the VCSEL, then monitoring a performance parameter such as the optical output from the waveguide while attaching the assembly to the submount. A conductive adhesive may be used that is cured to fix the alignment when the performance parameter has been maximized, or for example, when a desired output power is reached. Many other parameters could also be measured to determine optimum alignment, for example, the threshold current where the device starts lasing, the optical power emitted out of the VCSEL surface opposite the submount, the voltage across the diode, the width of the central wavelength peak and suppression of side modes from optical spectrum analysis, and the beam profile of an emission from the VCSEL surface opposite the submount.

The laser is coupled to the transducer assembly and the light beam is directly coupled into the waveguide without the need for external optical configurations. Once the light beam is coupled into the waveguide, the light propagates through the waveguide toward a truncated end of the waveguide that is formed adjacent the air bearing surface (ABS) of the recording head. Light exits the end of the waveguide and heats a portion of the media, as the media moves relative to the recording head. A near-field transducer can be positioned in or adjacent to the waveguide to further concentrate the light in the vicinity of the air bearing surface, as shown in FIG. 2.

In another aspect, the disclosure encompasses a data storage device that includes the transducer assembly described above. The data storage device includes a storage medium, a recording head, and an arm for positioning the recording head adjacent to the storage medium, wherein the recording head includes a transducer assembly including a planar waveguide and a horizontal coupler structured to couple electromagnetic radiation into the waveguide, and an extended cavity vertical cavity surface emitting laser having an active region, a first mirror position adjacent to a first side of the active region, an extended cavity positioned adjacent to a second side of the active region, and a second mirror positioned near an end of the extended cavity and adjacent to the horizontal coupler.

It is to be understood that even though numerous characteristics and advantages of various embodiments of the invention have been set forth in the foregoing description, together with details of the structure and function of various embodiments of the invention, the described embodiments are illustrative only, and changes may be made in detail, especially in matters of structure and arrangement of parts within the principles of the present invention to the full extent indicated by the broad general meaning of the terms in which the appended claims are expressed. For example, the particular elements may vary depending on the particular application without departing from the spirit and scope of the present invention.

The implementations described above and other implementations are within the scope of the following claims.

What is claimed is:

1. An apparatus comprising:
   an extended cavity vertical cavity surface emitting laser producing light and having an active region, a first reflector position adjacent to a first side of the active region, and an extended cavity positioned adjacent to a second side of the active region;
   a second reflector with a first side positioned adjacent to the extended cavity and reflecting a first portion of the light into the extended cavity and transmitting a second portion of the light;
   a planar waveguide positioned adjacent to a second side of the second reflector; and
   a horizontal coupler positioned adjacent to the second side of the second reflector and structured to couple the second portion of light from the extended cavity vertical cavity surface emitting laser into the waveguide.

2. The apparatus of claim 1, wherein the horizontal coupler comprises an angled blazed grating.

3. The apparatus of claim 1, wherein the extended cavity comprises a transparent stand-off.

4. The apparatus of claim 3, wherein the extended cavity comprises a gap between the transparent stand-off and the second mirror.

5. The apparatus of claim 4, wherein the gap is filled with a transparent material.

6. The apparatus of claim 1, further comprising:
   a lens in the extended cavity focusing the light onto the horizontal coupling element.

7. The apparatus of claim 6, wherein the horizontal coupling element comprises a slanted mirror.

8. The apparatus of claim 1, wherein the extended cavity vertical cavity surface emitting laser is mounted on the waveguide using a curable conductive adhesive, and is aligned with the waveguide to maximize a performance parameter prior to curing the adhesive.

9. An apparatus comprising:
   an extended cavity vertical cavity surface emitting laser producing light and having an active region, a first reflector position adjacent to a first side of the active region, an extended cavity positioned adjacent to a second side of the active region;
   a planar waveguide;
   a horizontal coupler structured to couple the light into the waveguide and out of the waveguide toward the active region; and
   a second reflector positioned in the waveguide to reflect a first portion of the light toward the horizontal coupler and transmitting a second portion of the light.

10. The apparatus of claim 9, wherein the second reflector comprises a distributed Bragg reflector.

11. The apparatus of claim 9, wherein the horizontal coupler comprises an angled blazed grating.

12. The apparatus of claim 9, wherein the extended cavity comprises a transparent stand-off.

13. The apparatus of claim 12, wherein the extended cavity comprises a gap between the transparent stand-off and the second mirror.

14. The apparatus of claim 13, wherein the gap is filled with a transparent material.

15. The apparatus of claim 9, further comprising:
first and second electrical contacts that are electrically connected to the active region through first and second vias in the extended cavity.

16. The apparatus of claim 9, wherein the extended cavity vertical cavity surface emitting laser is mounted on the waveguide using a curable conductive adhesive, and is aligned with the waveguide prior to curing the adhesive.

17. An apparatus comprising:
a storage medium;
a recording head; and
an arm for positioning the recording head adjacent to the storage medium; wherein the recording head includes a transducer assembly including an extended cavity vertical cavity surface emitting laser producing light and having an active region, a first reflector position adjacent to a first side of the active region, and an extended cavity positioned adjacent to a second side of the active region, a second reflector with a first side positioned adjacent to the extended cavity, the second reflector positioned to reflect a first portion of the light into the extended cavity and to transmit a second portion of the light, a planar waveguide positioned adjacent to a second side of the second reflector, and a horizontal coupler positioned adjacent to the second side of the second reflector and structured to couple the second portion of the light into the waveguide.

18. The apparatus of claim 17, wherein the horizontal coupler comprises an angled blazed grating.

19. The apparatus of claim 17, wherein the second mirror comprises a plurality of layers.

20. The apparatus of claim 17, wherein the second mirror comprises a distributed Bragg reflector.

* * * * *